US009742385B2

(12) United States Patent
Alexander

(10) Patent No.: US 9,742,385 B2
(45) Date of Patent: Aug. 22, 2017

(54) BIDIRECTIONAL SEMICONDUCTOR SWITCH WITH PASSIVE TURNOFF

(71) Applicant: Ideal Power Inc., Austin, TX (US)

(72) Inventor: William C. Alexander, Spicewood, TX (US)

(73) Assignee: Ideal Power, Inc., Austin, TX (US)

( * ) Notice: Subject to any disclaimer, the term of this patent is extended or adjusted under 35 U.S.C. 154(b) by 0 days.

(21) Appl. No.: 15/213,389

(22) Filed: Jul. 18, 2016

(65) Prior Publication Data
US 2017/0047922 A1 Feb. 16, 2017

Related U.S. Application Data

(63) Continuation-in-part of application No. 14/937,814, filed on Nov. 10, 2015, which is a
(Continued)

(51) Int. Cl.
*H01L 29/732* (2006.01)
*H03K 5/08* (2006.01)
(Continued)

(52) U.S. Cl.
CPC .......... *H03K 5/08* (2013.01); *H01L 29/0619* (2013.01); *H01L 29/0804* (2013.01);
(Continued)

(58) Field of Classification Search
CPC .......... H03K 5/08; H03K 17/68; H03K 17/74; H03K 2217/0009; H01L 29/73;
(Continued)

(56) References Cited

U.S. PATENT DOCUMENTS 3,476,993 A   11/1969   Aldrich et al.
3,996,601 A   12/1976   Hutson
(Continued)

FOREIGN PATENT DOCUMENTS

DE   2231777 A1   3/1973
DE   4011509 A1   10/1990
(Continued)

OTHER PUBLICATIONS

A. Bourennane et al., "High temperature wafer bonding technique for the realization of a voltage and current bidirectional IGBT", "Power Semiconductor Devices and ICs (ISPSD), 2011 IEEE 23rd International Symposium on", May 26, 2011, pp. 120-123, Publisher: IEEE.
(Continued)

*Primary Examiner* — William F Kraig
*Assistant Examiner* — Pavel Ivanov
(74) *Attorney, Agent, or Firm* — Groover & Associates PLLC; Gwendolyn G. Corcoran; Robert O. Groove, III

(57) ABSTRACT

A symmetrically-bidirectional bipolar transistor circuit where the two base contact regions are clamped, through a low-voltage diode and a resistive element, to avoid bringing either emitter junction to forward bias. This avoids bipolar gain in the off state, and thereby avoids reduction of the withstand voltage due to bipolar gain.

15 Claims, 4 Drawing Sheets

Related U.S. Application Data continuation-in-part of application No. 14/735,782, filed on Jun. 10, 2015, now Pat. No. 9,190,894, which is a continuation of application No. 14/514,988, filed on Oct. 15, 2014, now Pat. No. 9,059,710, which is a continuation of application No. 14/313,960, filed on Jun. 24, 2014, now Pat. No. 9,029,909.

(60) Provisional application No. 62/194,167, filed on Jul. 17, 2015, provisional application No. 62/182,878, filed on Jun. 22, 2015, provisional application No. 62/077,777, filed on Nov. 10, 2014, provisional application No. 61/928,133, filed on Jan. 16, 2014, provisional application No. 61/928,644, filed on Jan. 17, 2014, provisional application No. 61/929,731, filed on Jan. 21, 2014, provisional application No. 61/929,874, filed on Jan. 21, 2014, provisional application No. 61/933,442, filed on Jan. 30, 2014, provisional application No. 62/007,004, filed on Jun. 3, 2014, provisional application No. 62/008,275, filed on Jun. 5, 2014, provisional application No. 61/838,578, filed on Jun. 24, 2013, provisional application No. 61/841,624, filed on Jul. 1, 2013, provisional application No. 61/914,491, filed on Dec. 11, 2013, provisional application No. 61/914,538, filed on Dec. 11, 2013, provisional application No. 61/924,884, filed on Jan. 8, 2014, provisional application No. 61/925,311, filed on Jan. 9, 2014, provisional application No. 62/194,146, filed on Jul. 17, 2015.

(51) Int. Cl.
| | |
|---|---|
| *H01L 29/872* | (2006.01) |
| *H01L 29/747* | (2006.01) |
| *H03K 17/74* | (2006.01) |
| *H01L 29/417* | (2006.01) |
| *H01L 29/423* | (2006.01) |
| *H01L 29/73* | (2006.01) |
| *H01L 29/737* | (2006.01) |
| *H01L 29/739* | (2006.01) |
| *H01L 29/74* | (2006.01) |
| *H01L 29/06* | (2006.01) |
| *H01L 29/08* | (2006.01) |
| *H01L 29/10* | (2006.01) |
| *H01L 29/16* | (2006.01) |
| *H03K 17/68* | (2006.01) |

(52) U.S. Cl.
CPC ...... *H01L 29/0817* (2013.01); *H01L 29/0821* (2013.01); *H01L 29/1004* (2013.01); *H01L 29/16* (2013.01); *H01L 29/1604* (2013.01); *H01L 29/41708* (2013.01); *H01L 29/42304* (2013.01); *H01L 29/73* (2013.01); *H01L 29/732* (2013.01); *H01L 29/7375* (2013.01); *H01L 29/7393* (2013.01); *H01L 29/7395* (2013.01); *H01L 29/747* (2013.01); *H01L 29/7416* (2013.01); *H01L 29/872* (2013.01); *H03K 17/68* (2013.01); *H03K 17/74* (2013.01); *H03K 2217/0009* (2013.01)

(58) Field of Classification Search
CPC ............ H01L 29/732; H01L 29/41708; H01L 29/42304; H01L 29/7375; H01L 29/7393; H01L 29/7395; H01L 29/7416; H01L 29/0619; H01L 29/0804; H01L 29/0817; H01L 29/0821; H01L 29/1004; H01L 29/16; H01L 29/1604; H01L 29/872; H01L 29/747

See application file for complete search history.

(56) References Cited

U.S. PATENT DOCUMENTS

| | | | |
|---|---|---|---|
| 4,131,902 A | 12/1978 | Kub | |
| 4,816,892 A | 3/1989 | Temple | |
| 4,980,743 A | 12/1990 | Nakagawa et al. | |
| 5,034,632 A * | 7/1991 | Jansson | H03K 19/013 326/19 |
| 5,040,042 A | 8/1991 | Bauer et al. | |
| 5,608,237 A | 3/1997 | Aizawa | |
| 5,793,064 A | 8/1998 | Li | |
| 5,852,559 A | 12/1998 | Li | |
| 5,910,664 A | 6/1999 | Ajit | |
| 6,313,488 B1 | 11/2001 | Bakowski et al. | |
| 7,728,367 B2 | 6/2010 | Bui | |
| 8,796,750 B2 | 8/2014 | Bui | |
| 2002/0060330 A1 | 5/2002 | Onishi et al. | |
| 2003/0042537 A1 | 3/2003 | Nakamura et al. | |
| 2003/0057480 A1 | 3/2003 | Mathieu | |
| 2004/0070027 A1 | 4/2004 | Nielson et al. | |
| 2005/0090107 A1 | 4/2005 | Draney | |
| 2005/0245006 A1* | 11/2005 | Tseng | H01L 29/0692 438/140 |
| 2005/0258493 A1 | 11/2005 | Aono | |
| 2006/0118818 A1 | 6/2006 | Shimoida et al. | |
| 2006/0249752 A1 | 11/2006 | Asano | |
| 2006/0261346 A1 | 11/2006 | Ryu et al. | |
| 2008/0191238 A1 | 8/2008 | Madathil et al. | |
| 2009/0058500 A1 | 3/2009 | Osawa et al. | |
| 2010/0327355 A1 | 12/2010 | Yuan et al. | |
| 2011/0121407 A1 | 5/2011 | Quoirin et al. | |
| 2012/0175729 A1 | 7/2012 | Bowman | |
| 2014/0111892 A1 | 4/2014 | Chen et al. | |
| 2014/0240027 A1 | 8/2014 | Blanchard et al. | |
| 2014/0339600 A1 | 11/2014 | Yoshikawa | |
| 2014/0375287 A1* | 12/2014 | Blanchard | H01L 29/0817 323/271 |
| 2014/0376291 A1* | 12/2014 | Blanchard | H01L 29/0817 363/123 |

FOREIGN PATENT DOCUMENTS

| | | |
|---|---|---|
| DE | 4014207 A1 | 12/1990 |
| DE | 102004005384 A1 | 8/2005 |
| DE | 102005047101 B3 | 1/2007 |
| EP | 0111804 B1 | 9/1987 |
| EP | 0438700 A1 | 7/1991 |
| EP | 2325890 | 5/2011 |
| GB | 1513000 A | 6/1978 |
| GB | 2380604 B2 | 2/2005 |
| GB | 2510716 A1 | 8/2014 |
| JP | S58218168 A | 12/1983 |
| JP | H01146366 A2 | 6/1989 |
| JP | H03147378 A | 6/1991 |
| JP | 2004342718 A2 | 12/2004 |
| JP | 2008205512 A2 | 9/2008 |
| JP | 2009141270 A2 | 6/2009 |
| JP | 2009295684 A2 | 12/2009 |
| WO | 2011008567 | 1/2011 |
| WO | 2014122472 A1 | 8/2014 |

OTHER PUBLICATIONS

Jean-Christophe Crebier, "Integration monolithique et composants de puissance", "Institut National Polytechnique de Grenoble— INPG", Jul. 17, 2006.

"European Search Report in related EP Application No. 14816902.2 (published as EP2901483), dated Sep. 14, 2015", Sep. 14, 2015, Publisher: European Patent Office.

Der-Feng Guo et al., "Investigation of Amplifying and Switching Characteristics in Double Heterostructure-Emitter Bipolar Transis-

(56) References Cited

OTHER PUBLICATIONS tors", "Journal of the Electrochemical Society", Jan. 1, 2007, p. H283, vol. 154, No. 4.

K.D. Hobart et al., "Characterization of a Bi-Directional Double-Side Double-Gate IGBT Fabricated by Wafer Bonding", "Power Semiconductor Devices and ICs, 2001, Proceedings of the 13th International Symposium on", Jun. 7, 2001, pp. 125-128, Publisher: ISPSD '01.

Ideal Power Inc., "B-Tran—Bi-Directional Bi-Polar Junction TRANsistor", Aug. 20, 2015, Published in: US.

Ngwendson Luther-King et al., "MOS Control Device Concepts for AC-AC Matrix Converter Applications: The HCD Concept for High-Efficiency Anode-Gated Devices", "IEEE Transactions on Electron Devices", Sep. 9, 2005, pp. 2075-2080, vol. 52, No. 9, Publisher: IEEE.

Binh-Dac Nguyen et al., "AC switches with integrated gate driver supplies", "Power Electronics and Applications, 2005 European Conference on", Sep. 14, 2005, pp. 1-9, Publisher: IEEE, Published in: Dresden, Germany.

Ronald Yutaka Nishi, "Theory of Conductivity Modulation in Semiconductors", Jun. 1, 1962, Publisher: University of British Columbia.

Luong Viet Phung et al., "Modeling of a New SOI Bidirectional Bipolar Junction Transistor for Low-Loss Household Appliances", "Electron Devices, IEEE Transactions on", Mar. 22, 2011, pp. 1164-1169, vol. 58, No. 4, Publisher: IEEE.

Luong Viet Phung et al., "Modelling of a symmetrical bipolar monolithic bidirectional switch", "Power Electronics and Applications, 2009. EPE '09. 13th European Conference on", Sep. 10, 2009, pp. 1-9, Publisher: IEEE, Published in: Barcelona, Spain.

J.-W. Wu et al., "Low-temperature hydrophobic wafer bonding for 1200V, 25A bi-directional Si UMOS IGBTs", "Lester Eastman Conference on High Performance Devices (LEC)", Aug. 7, 2014, pp. 1-4.

Shanqi Zhao et al., "Design, fabrication and characterization of a bi-directional insulated gate bipolar transistor", "Solid-State and Integrated Circuits Technology", Oct. 21, 2004, vol. 1, Publisher: Solid-State and Integrated Circuits Technology.

* cited by examiner

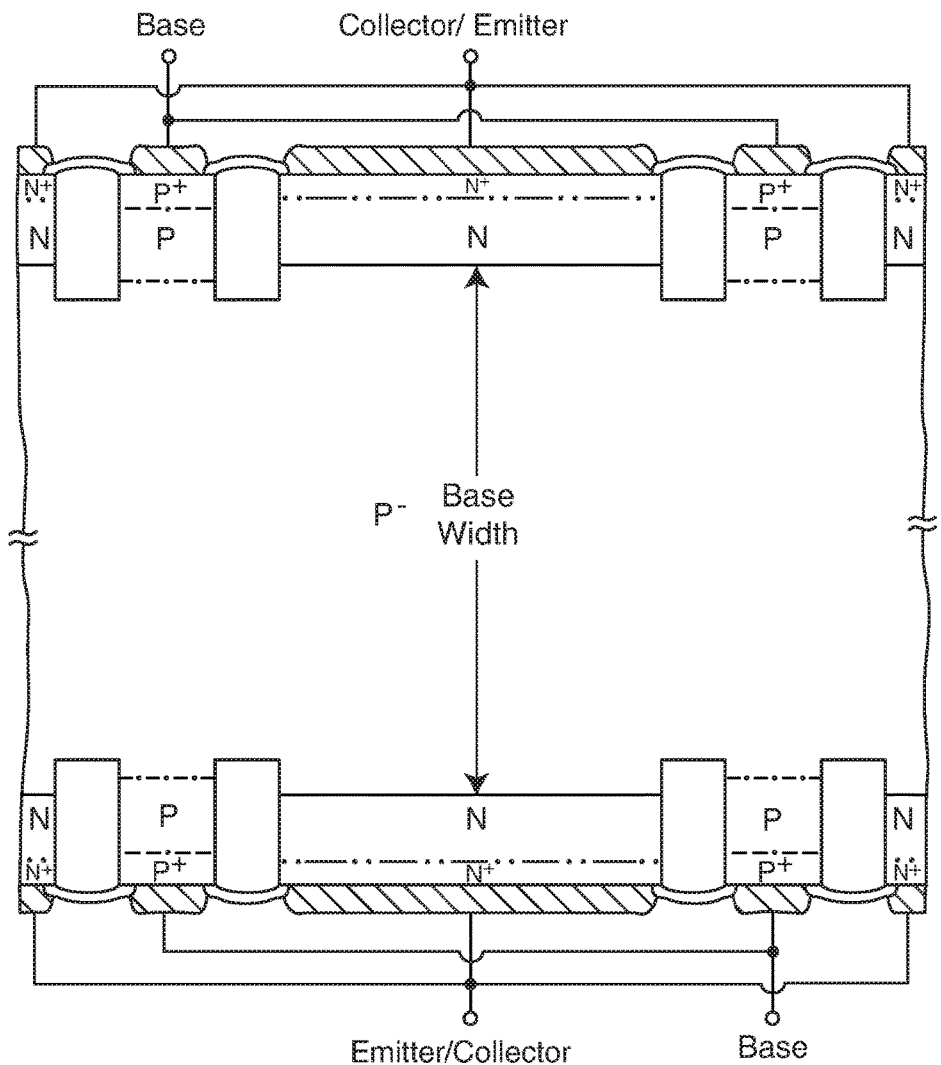
Figure 1. Cross section of a B-TRAN having dielectric-filled trenches.
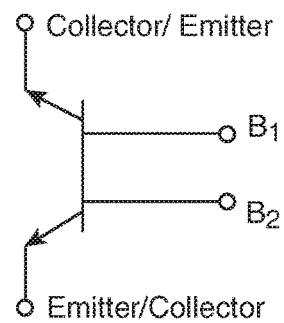
Figure 2. A circuit symbol for the B-TRAN.

BIDIRECTIONAL SEMICONDUCTOR SWITCH WITH PASSIVE TURNOFF

CROSS-REFERENCE

Priority is claimed from Ser. No. 62/194,146, filed Jul. 17, 2015, which is hereby incorporated by reference. Priority is also claimed (as a continuation-in-part) from Ser. No. 14/937,814, and therethrough to its provisional antecedents.

BACKGROUND

The present application relates to bidirectional switches, and particularly to symmetrically-bidirectional power bipolar transistors.

Note that the points discussed below may reflect the hindsight gained from the disclosed inventions, and are not necessarily admitted to be prior art.

Published US application US 2014-0375287 (which is hereby incorporated by reference in its entirety) discloses (inter al/a) novel bidirectional bipolar transistors known as "B-TRANs." Further improvements to the B-TRAN device and its modes of operation where disclosed in application Ser. Nos. 14/937,814 and 14/882,316.

One sample embodiment of a B-TRAN can be seen in FIG. 1. Note that the two surfaces of the die are essentially identical.

A sample circuit symbol is shown in FIG. 2. This circuit symbol resembles that of a bipolar junction transistor, except that two base connections are shown. This corresponds to the device structure of FIG. 1, where two different base contact regions are placed on the two surfaces of the die.

FIG. 3 shows one sample embodiment of a B-TRAN drive circuit, as extensively described in the parent applications.

FIG. 4 shows another sample embodiment of a B-TRAN. In this embodiment the trenches contain field plates; the capacitive coupling to the field plates helps to smooth the nearby voltage gradient in the vertical direction.

The preferred modes of operation of the BTRAN are surprisingly complex. To achieve high bipolar gain reliably, in a bidirectional device, the parent applications teach that the following stages of operation can be used.

At turn-on, an initial flow of current is allowed to occur in "diode mode" before bipolar transistor operation begins. In diode mode, the voltage drop across the device is (of course) at least a diode drop; but when base current drive is applied, the forward voltage drop can be reduced to a few hundred millivolts.

At turn-off, base current is disabled first, so that the device is again operating as a diode. After this, the device can be put into the "active off" mode, where one of the two junctions is reverse biased and blocks current.

A further surprising mode taught in the parent application is the "passive-off" mode. A problem with a vully bidirectional device is that the bipolar gain can interfere with current blocking in the off state. To avoid this, the emitter junction on either surface of the device is clamped to avoid any significant forward bias. (Properly, the "emitter junction" referred to here is the junction between either of the (typically n-type) emitter/collector regions and the (typically p-type) substrate.) By keeping the emitter junctions well away from turn-on, minority carrier injection is limited, and the gain of the bipolar transistor does not degrade the breakdown voltage.

Bidirectional Semiconductor Switch with Passive Turnoff

The present application teaches, among other innovations, a bidirectional bipolar transistor in which the transistor's gain is automatically prevented from degrading the breakdown voltage when the device is off. Preferably each surface of the device has a base contact region and an emitter/collector region; the polarity of the externally applied voltage will determine which of the two emitter/collector regions will act as emitter, and which as collector. The passive turnoff circuit clamps each base contact region to less than a diode drop from the neighboring emitter/collector region, so that bipolar transistor operation is avoided.

BRIEF DESCRIPTION OF THE DRAWINGS

The disclosed inventions will be described with reference to the accompanying drawings, which show important sample embodiments and which are incorporated in the specification hereof by reference, wherein:

FIG. 1 shows one sample embodiment of a B-TRAN.

FIG. 2 shows a sample circuit symbol for a B-TRAN.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

Figure 3:
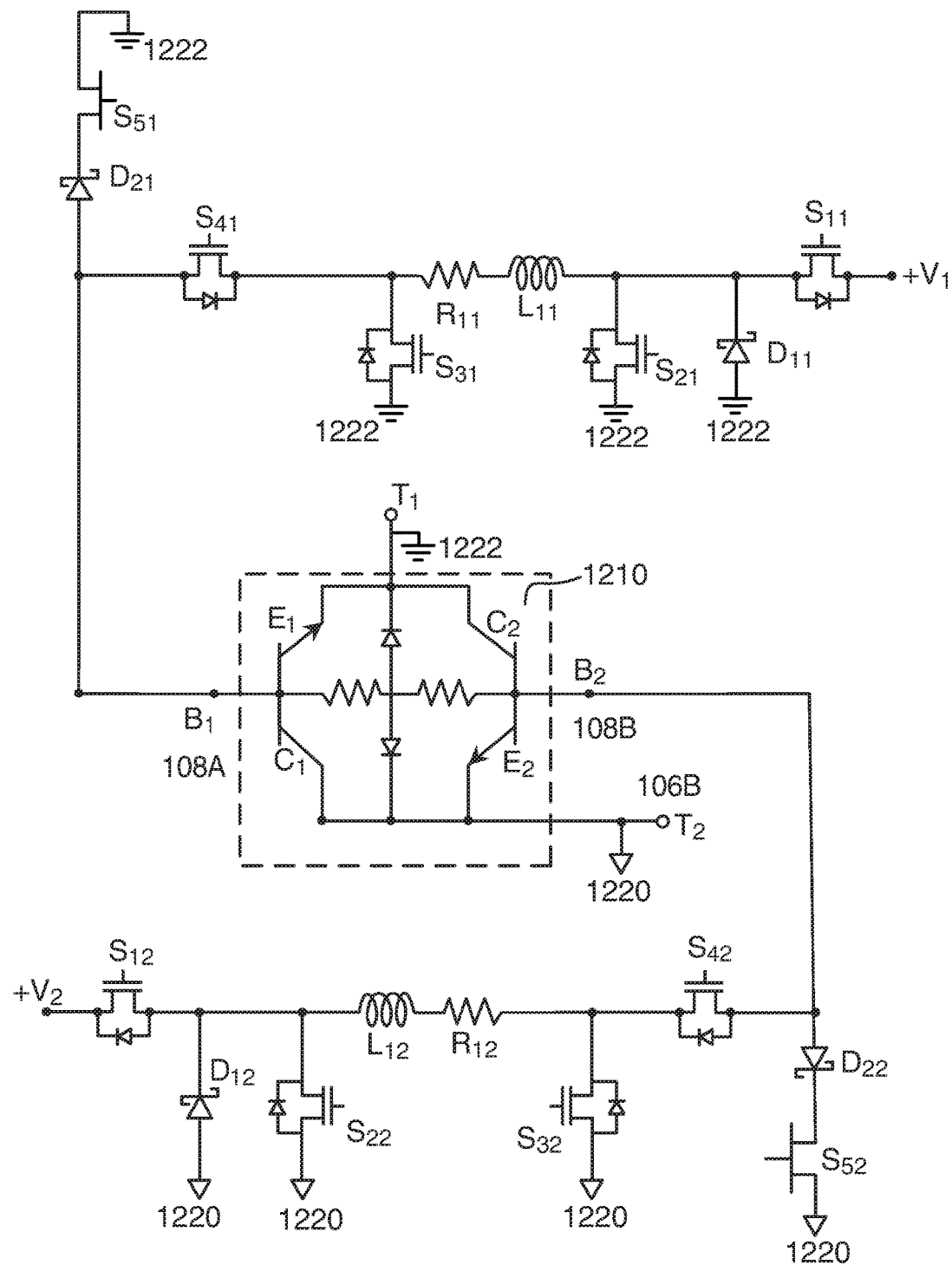
FIG. 3 shows one sample embodiment of a B-TRAN drive circuit.
Figure 4:
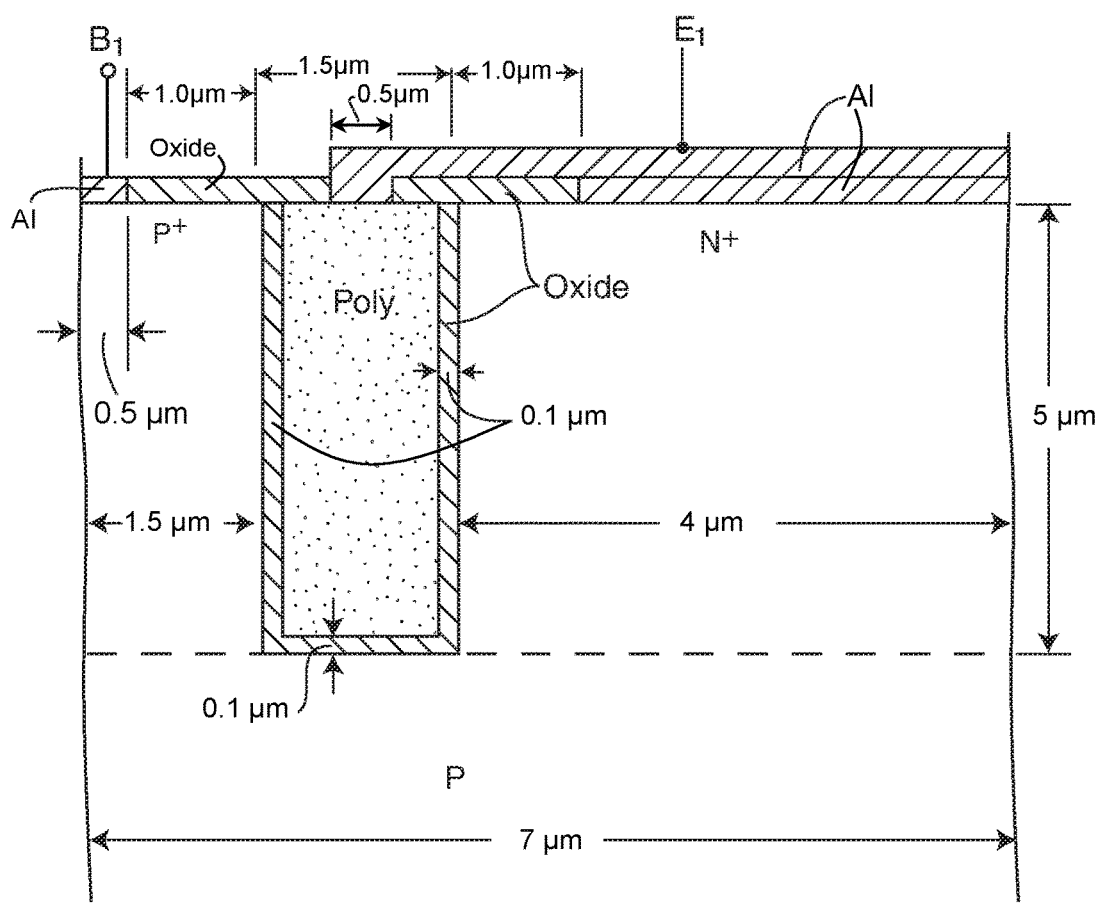
FIG. 4 shows another sample embodiment of a B-TRAN.
Figure 5:
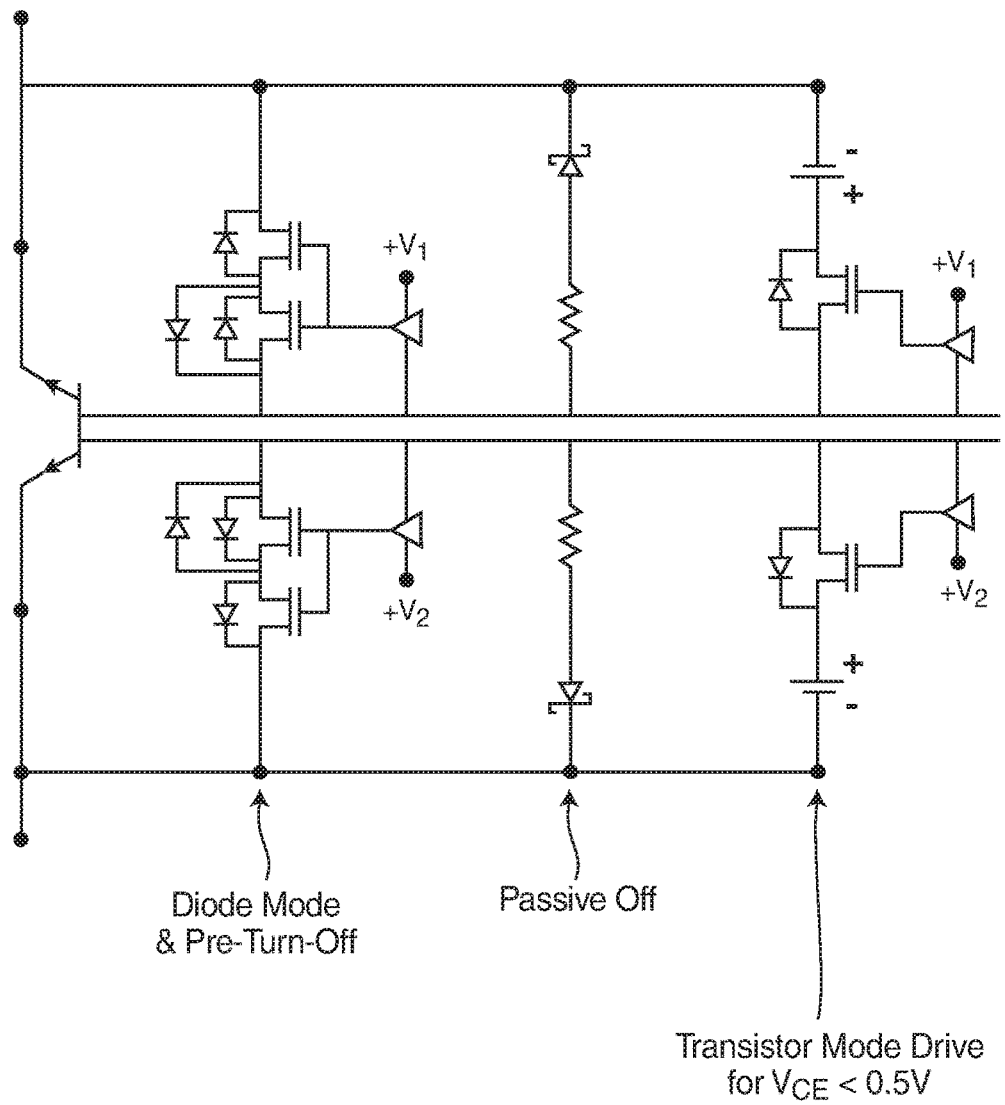
FIG. 5 shows an alternative circuit realization of the passive-off function.

The present application describes a new implementation of the passive-off mode described in published US application US 2014-0375287. FIG. 5 shows an alternative circuit realization of the passive-off function. The normally-ON switches (implemented as JFETs in FIG. 3, which corresponds to FIG. 12 of WO2014/210072) are replaced by resistors.

In selecting the resistors to replace the normally-ON switches, the ON- and OFF-state behaviors must be balanced, so that the breakdown voltage in passive-off mode must be sufficiently high, while not significantly reducing the gain.

A B-TRAN is in the "active off-state" when the e-base (base on emitter side) is shorted to the emitter, and the c-base (base on the collector side) is open. In this state with the NPN B-TRAN, the collector is the anode (high voltage side), and the emitter is the cathode (low voltage side).

The B-TRAN is also off when both bases are open, but due to the high gain of the B-TRAN in this state, the breakdown voltage is low. The series combination of a normally-on JFET (as in earlier versions, shown in FIG. 3) and a Schottky diode, or a resistor (as taught herein, shown in FIG. 5) and a Schottky diode, attached between each base on its respective emitter/collector, as previously disclosed, will significantly increase the blocking voltage in this "passive off-state". The JFETs, if present, are turned off during normal operation.

One advantageous sample method for turn-on is to simultaneously, from the active off-state and blocking forward voltage, open the e-base to emitter short while shorting the c-base to the collector. This immediately introduces charge carries into the highest field region of the depletion zone around the collector/base junction, so as to achieve very fast, forward biased turn-on for hard switching, very similar to IGBT turn-on.

Another advantageous sample turn-on method, from the active off-state, is to have the circuit containing the B-TRAN reverse the B-TRAN polarity, which produces the same base state described in the hard turn-on method, but at near zero voltage. That is, the e-base which is shorted to the emitter becomes the c-base shorted to the collector as the B-TRAN voltage reverses from the active off-state polarity. And again, turn-on is fast.

In a third sample turn-on method from the active off-state, the e-base is disconnected from the emitter, and connected to a current or voltage source of sufficient voltage to inject charge carriers into the base region. This method is likely slower, since the charge carriers go into the base just below the depletion zone. Also, it is known that carrier injection into the e-base results in inferior gain relative to carrier injection into the c-base.

After turn-on is achieved with either of the methods using the c-base, collector-emitter voltage Vce is more than a diode drop. To drive Vce below a diode drop, turn-on goes to the second stage of increased charge injection into the c-base via a voltage or current source. The amount of increased charge injection determines how much Vce is reduced below a diode drop. Injection into the e-base will also reduce Vce, but the gain is much lower than with c-base injection.

Turn-off can be achieved by any of several methods. The most advantageous method is a two-step process. In the first step, the c-base is disconnected from the carrier injection power supply and shorted to the collector, while the previously open e-base is shorted to the emitter. This results in a large current flow between each base and its emitter/collector, which rapidly removes charge carriers from the drift region. This in turn results in a rising Vce as the resistivity of the drift region increases. At some optimum time after the bases are shorted, the connection between the c-base and the collector is opened, after which Vce increases rapidly as the depletion region forms around the collector/base junction.

Alternately, turn-off can be achieved by simply opening the c-base and shorting the e-base to the emitter, but this will result in higher turn-off losses since the drift region (base) will have a high level of charge carriers at the start of depletion zone formation.

Or, turn-off can be achieved by simply opening the c-base and leaving the e-base open, but this will result in the highest turn-off losses and also a low breakdown voltage.

Advantages

The disclosed innovations, in various embodiments, provide one or more of at least the following advantages. However, not all of these advantages result from every one of the innovations disclosed, and this list of advantages does not limit the various claimed inventions.
Improved efficiency in power conversion systems;
Power semiconductor devices with more ruggedness;
Power semiconductor devices with higher breakdown voltage;
Power semiconductor devices with lower on-resistance:
Power semiconductor devices with lower cost;
Integrable power semiconductor devices;
Motor operation with better control of power factor;
Better ground-fault protection in power conversion systems, with reduced likelihood of tripping ground-fault protection.

According to some but not necessarily all embodiments, there is provided: A switching circuit comprising: a two-base bidirectional npn semiconductor device which includes n-type emitter/collector regions and also p-type base contact regions on both opposed surfaces of a p-type monolithic semiconductor die; control circuitry which is connected separately to the first and second base contact regions on the opposed surfaces; and first and second distinct clamp circuits, each comprising a series combination of a low-voltage diode and a resistive element, connected so that the anode of the low-voltage diode is operatively connected to the p-type base contact region, and the cathode of the low-voltage diode is operatively connected to the n-type emitter/collector region; wherein the low-voltage diode turns on at a forward voltage which is less than the diode drop of the p-n junction between an emitter/collector region and the semiconductor die; whereby the p-n junction between the emitter/collector region and the semiconductor die is clamped to avoid forward bias.

According to some but not necessarily all embodiments, there is provided: A switching circuit comprising: a double-base bipolar transistor, having distinct n-type emitter/collector regions on both first and second opposite surfaces of a p-type semiconductor die, each emitter/collector region defining a p-n emitter junction with respect to the die; first and second clamp circuits operatively connected to said first and second opposite surfaces, each including a diode and a resistive element in series, with the anode of the diode operatively connected to the p side of the respective emitter junction, and the cathode operatively connected to the n side of the respective emitter junction; wherein the diodes have forward diode voltage drops which are substantially less than the forward diode voltage drop characteristic of the respective p-n emitter junction.

According to some but not necessarily all embodiments, there is provided: A switching circuit comprising: a double-base bipolar transistor, having distinct emitter/collector regions on both first and second opposite surfaces of an n-type semiconductor die, each emitter/collector region defining a p-n emitter junction with respect to the die; first and second clamp circuits on said first and second surfaces, each including a diode and a resistor in series, with the anode of the diode operatively connected to the p side of the respective emitter junction, and the cathode operatively connected to the n side of the respective emitter junction; wherein the diodes have forward diode voltage drops which are substantially less than the forward diode voltage drop characteristic of the respective p-n junction.

According to some but not necessarily all embodiments, there is provided: A symmetrically-bidirectional bipolar transistor circuit where the two base contact regions are each clamped, through a low-voltage diode and a resistive element, to avoid bringing either emitter junction to forward bias. This avoids bipolar gain in the off state, and thereby avoids reduction of the withstand voltage due to bipolar gain.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A switching circuit comprising:
  a two-base bidirectional npn semiconductor device which includes both n-type emitter/collector regions and also p-type base contact regions on each of both opposed surfaces of a p-type monolithic semiconductor die;
  control circuitry which is connected separately on the opposed surfaces to the first and second base contact regions; and
  first and second distinct clamp circuits, each comprising a series combination of a low-voltage diode and a resistive element, connected so that the anode of the respective low-voltage diode is operatively connected to the respective p-type base contact region, and the cathode of the respective low-voltage diode is operatively connected to the respective n-type emitter/collector region;
  wherein the low-voltage diode turns on at a forward voltage which is less than the diode drop of the respective p-n junction between each emitter/collector region and the semiconductor die;
  whereby the respective p-n junction between each emitter/collector region and the semiconductor die is clamped to avoid forward bias.

2. The switching circuit of claim 1, wherein the die is silicon.

3. The switching circuit of claim 1, wherein the low-voltage diode is a Schottky barrier diode.

4. The switching circuit of claim 1, wherein the die is silicon, and the low-voltage diode is a Schottky barrier diode.

5. The switching circuit of claim 1, wherein the emitter/collector region on the first said surface is not electrically connected to the emitter/collector region on the second said surface, except through the semiconductor die itself.

6. The switching circuit of claim 1, wherein the base contact region on the first said surface is not electrically connected to the base contact region on the second said surface, except through the semiconductor die itself.

7. A switching circuit comprising:
  a double-base bipolar transistor, having distinct n-type emitter/collector regions on both first and second opposite surfaces of a p-type semiconductor die, each emitter/collector region defining a p-n emitter junction with respect to the die;
  first and second clamp circuits operatively connected to on said first and second opposite surfaces, each circuit including a diode and a resistive element in series, with the anode of the diode operatively connected to the p side of the respective p-n emitter junction, and the cathode operatively connected to the n side of the respective p-n emitter junction;
  wherein the diodes have forward diode voltage drops which are less than the forward diode voltage drop characteristic of the respective p-n emitter junction.

8. The switching circuit of claim 7, wherein the die is silicon.

9. The switching circuit of claim 7, wherein the diode is a Schottky barrier diode.

10. The switching circuit of claim 7, wherein the die is silicon, and the diode is a Schottky barrier diode.

11. The switching circuit of claim 7, wherein the emitter/collector region on the first surface is not electrically connected to the emitter/collector region on the second surface, except through the semiconductor die itself.

12. A switching circuit comprising:
  a double-base bipolar transistor, having distinct emitter/collector regions on both first and second opposite surfaces of an n-type semiconductor die, each emitter/collector region defining a p-n emitter junction with respect to the die;
  first and second clamp circuits operatively connected to said first and second surfaces, each circuit including a diode and a resistor in series, with the anode of the diode operatively connected to the p side of the respective p-n emitter junction, and the cathode operatively connected to the n side of the respective p-n emitter junction;
  wherein the diodes have forward diode voltage drops which are less than the forward diode voltage drop characteristic of the respective p-n junction.

13. The switching circuit of claim 12, wherein the die is silicon.

14. The switching circuit of claim 12, wherein the diode is a Schottky barrier diode.

15. The switching circuit of claim 12, wherein the die is silicon, and the diode is a Schottky barrier diode.

* * * * *